(12) United States Patent
Burgermeister

(10) Patent No.: US 12,308,755 B2
(45) Date of Patent: May 20, 2025

(54) FREQUENCY CONVERTER

(71) Applicant: Lenze Swiss AG, Romanshorn (CH)

(72) Inventor: Andreas Burgermeister, Mauren (CH)

(73) Assignee: Lenze Swiss AG, Romanshorn (CH)

( * ) Notice: Subject to any disclaimer, the term of this patent is extended or adjusted under 35 U.S.C. 154(b) by 147 days.

(21) Appl. No.: 18/129,147

(22) Filed: Mar. 31, 2023

(65) Prior Publication Data

US 2023/0318475 A1 Oct. 5, 2023

(30) Foreign Application Priority Data

Apr. 1, 2022 (DE) ...................... 10 2022 203 278.0

(51) Int. Cl.
*H02M 1/00* (2007.01)
*G01R 31/42* (2006.01)
(Continued)

(52) U.S. Cl.
CPC .......... *H02M 5/2932* (2021.05); *G01R 31/42* (2013.01); *H02M 1/0012* (2021.05);
(Continued)

(58) Field of Classification Search
CPC ............. H02M 1/0003; H02M 1/0012; H02M 1/0025; H02M 1/0064; H02M 1/14;
(Continued)

(56) References Cited

U.S. PATENT DOCUMENTS

| | | | | |
|---|---|---|---|---|
| 5,949,669 A | * | 9/1999 | Bruckmann | .............. B60L 9/16 363/136 |
| 2010/0128505 A1 | * | 5/2010 | Leppanen | .......... G01R 19/0092 363/131 |

(Continued)

FOREIGN PATENT DOCUMENTS

| | | | | |
|---|---|---|---|---|
| AT | 412684 B | * | 4/2005 | ............... H01G 9/14 |
| DE | 10 2012 104 801 A1 | | 12/2013 | |

(Continued)

OTHER PUBLICATIONS

German-language Office Action issued in German Application No. 10 2022 203 278.0 dated Jan. 11, 2023 (six (6) pages).

*Primary Examiner* — Thienvu V Tran
*Assistant Examiner* — Shahzeb K Ahmad
(74) *Attorney, Agent, or Firm* — Crowell & Moring LLP

(57) ABSTRACT

A frequency converter includes an intermediate circuit capacitor at which an intermediate circuit voltage is present, an inverter for generating control signals with a variable frequency and a variable amplitude from the intermediate circuit voltage, and a circuit for measuring the intermediate circuit voltage. The circuit for measuring the intermediate circuit voltage includes a resistive voltage divider, the intermediate circuit voltage being applied to the first side of the resistive voltage divider and the second side of the latter being electrically connected to a reference potential, a capacitive voltage divider, the intermediate circuit voltage being applied to the first side of the capacitive voltage divider and the second side of the latter being electrically connected to the reference potential, at least one connecting node of resistors of the resistive voltage divider being electrically connected to a corresponding connecting node of capacitors of the capacitive voltage divider, and an evaluation unit which evaluates a measurement voltage generated by means of the resistive voltage divider and the capacitive voltage divider for the purpose of measuring the intermediate circuit voltage.

4 Claims, 1 Drawing Sheet

(51) Int. Cl.
*H02M 5/293* (2006.01)
*H02M 5/458* (2006.01)
*H02M 1/14* (2006.01)

(52) U.S. Cl.
CPC ....... *H02M 1/0064* (2021.05); *H02M 5/4585* (2013.01); *H02M 1/14* (2013.01)

(58) Field of Classification Search
CPC ............ H02M 5/40; H02M 5/42; H02M 5/45; H02M 5/4505; H02M 5/451; H02M 5/452; H02M 5/453; H02M 5/458; H02M 5/4585; H02M 7/48; H02M 7/4833; H02M 7/487; G01R 31/42; G01R 15/06
See application file for complete search history.

(56) References Cited

U.S. PATENT DOCUMENTS

| | | | | |
|---|---|---|---|---|
| 2012/0281443 | A1* | 11/2012 | Wolf | H02J 3/381 |
| | | | | 363/55 |
| 2015/0288296 | A1* | 10/2015 | Kidera | H02M 7/5387 |
| | | | | 363/132 |
| 2017/0288573 | A1* | 10/2017 | Hong | H02M 7/487 |
| 2020/0169163 | A1* | 5/2020 | Nielsen | H02M 5/4585 |
| 2020/0212818 | A1* | 7/2020 | Kataoka | H02M 7/5395 |

FOREIGN PATENT DOCUMENTS

| | | | |
|---|---|---|---|
| DE | 10 2018 129 909 A1 | 5/2020 | |
| WO | WO-2012140149 A2 * | 10/2012 | ............. G01R 31/42 |

* cited by examiner

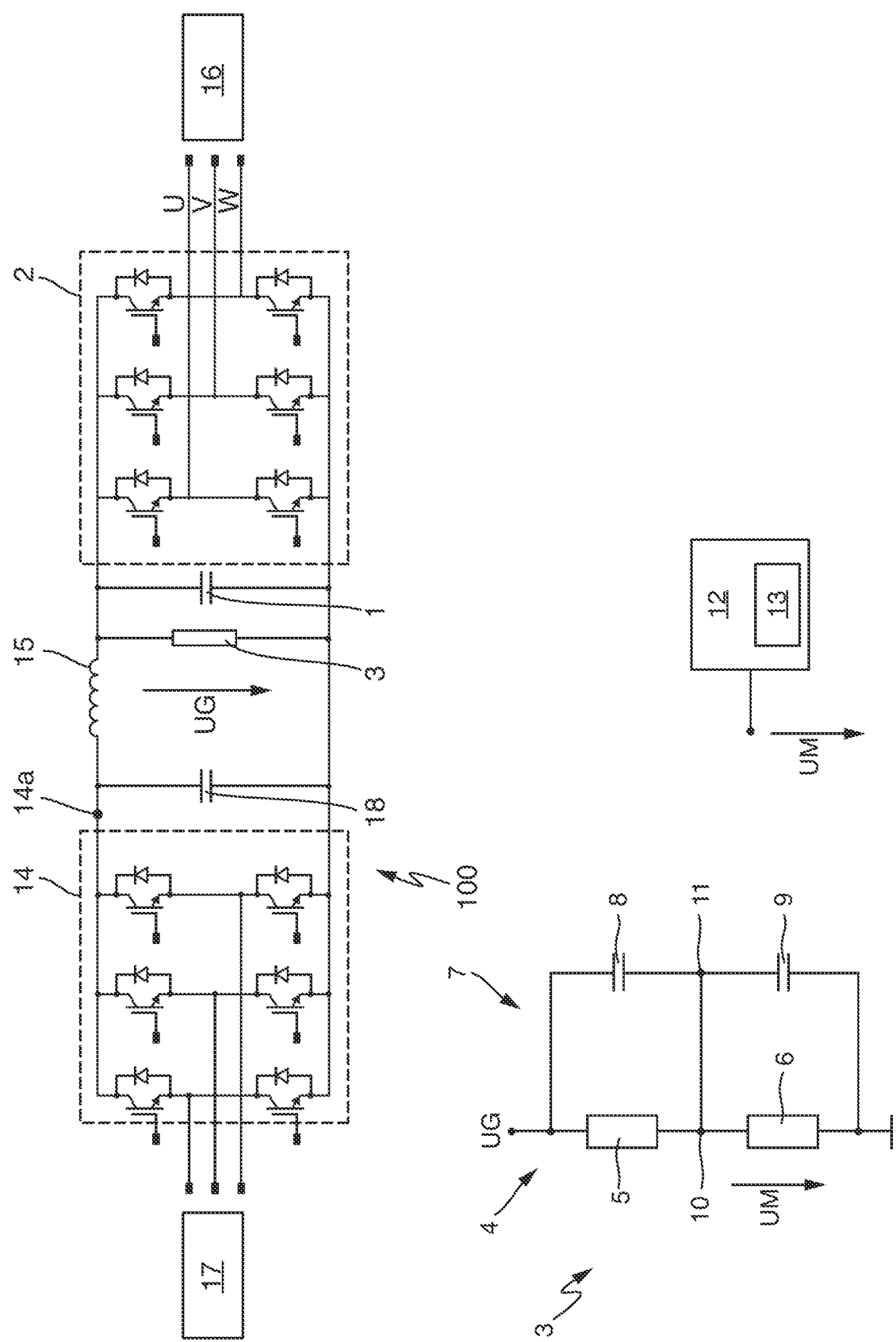

FREQUENCY CONVERTER

CROSS REFERENCE TO RELATED APPLICATION

This application claims priority under 35 U.S.C. § 119 from German Patent Application No. 10 2022 203 278.0, filed Apr. 1, 2022, the entire disclosure of which is herein expressly incorporated by reference.

BACKGROUND AND SUMMARY

The invention is based on the object of providing a frequency converter which makes it possible to measure an intermediate circuit voltage as dynamically and accurately as possible.

The frequency converter conventionally has an intermediate circuit capacitor at which an intermediate circuit (DC) voltage is present.

The frequency converter also conventionally has an inverter for generating control signals, in particular in the form of control voltages, with a variable frequency and a variable amplitude from the intermediate circuit voltage, for example with a B6 topology.

The frequency converter also has a circuit for measuring the intermediate circuit voltage.

The circuit for measuring the intermediate circuit voltage has: a resistive voltage divider having two or more resistors connected in series, the intermediate circuit voltage being applied to the first side of the resistive voltage divider and the second side of the latter being electrically connected to a reference potential, for example in the form of a negative intermediate circuit potential. The circuit for measuring the intermediate circuit voltage also has: a capacitive voltage divider having two or more capacitors connected in series, the intermediate circuit voltage being applied to the first side of the capacitive voltage divider and the second side of the latter being electrically connected to the reference potential. At least one connecting node of resistors of the resistive voltage divider is electrically connected to a corresponding connecting node of capacitors of the capacitive voltage divider. The circuit for measuring the intermediate circuit voltage also has: an evaluation unit which evaluates a measurement voltage generated by means of the resistive voltage divider and the capacitive voltage divider for the purpose of measuring or calculating the intermediate circuit voltage on the basis of the known resistance values of the resistive voltage divider and the known capacitances of the capacitive voltage divider.

In one embodiment, the inverter generates the control signals using pulse width modulation.

In one embodiment, the evaluation unit has an analog-to-digital (A/D) converter, the A/D converter being designed to sample the measurement voltage generated by means of the resistive voltage divider and the capacitive voltage divider in the middle of a respective period of the pulse width modulation. In other words, sampling is carried out precisely in the middle of the PWM-induced ripple by means of a sample-and-hold stage.

Due to the capacitors of the capacitive voltage divider and their capacitance ratio, even the rising/falling tendency of the intermediate circuit voltage is taken into account, as a result of which voltage trends can be recognized. The PWM ripple in the intermediate circuit voltage is automatically masked by sampling the intermediate circuit voltage in sync with a current measurement. The measured value (mean value of a PWM period) is already present in the middle of the PWM period as a result of the measurement precisely in the middle of the PWM ripple. Consequently, there is no longer any need for a filter which causes delays.

In one embodiment, a capacitance of a capacitor of the capacitive voltage divider, at which the measurement voltage is present, is greater by a factor of 10 to 100 than a capacitance of a further capacitor of the capacitive voltage divider.

In one embodiment, the frequency converter also has a rectifier, in particular an active rectifier, for generating the intermediate circuit voltage from a mains AC voltage, in particular a three-phase mains AC voltage, and a filter inductor which is looped in between an output pole of the rectifier and a connection of the intermediate circuit capacitor.

The invention enables a very fast and accurate intermediate circuit voltage measurement for frequency converters. For example, it is therefore possible to achieve the situation in which the set (three-phase) output voltages of the frequency converter have only the slightest deviations from a target value. The output voltages of a frequency converter with a low-capacitance intermediate circuit capacitor are therefore no longer influenced by a highly fluctuating intermediate circuit voltage. The smaller output voltage distortions result in fewer losses and less noise in the motor and therefore enable better motor control. Owing to the correct measured values, motor models are simulated more accurately. The invention therefore enables a highly accurate and fast intermediate circuit voltage measurement for frequency converters with a low intermediate circuit capacitance.

According to the invention, the intermediate circuit voltage measurement is carried out by means of a resistive voltage divider in combination with a capacitive voltage divider. The capacitance ratio of the capacitors, in particular of the other capacitors with respect to a base capacitor, makes it possible to compensate for a propagation delay during measurement, until newly set control voltages are present at the motor, in a certain range.

Other objects, advantages and novel features of the present invention will become apparent from the following detailed description of one or more preferred embodiments when considered in conjunction with the accompanying drawing.

BRIEF DESCRIPTION OF THE DRAWING

FIG. 1 shows a frequency converter according to the invention having a circuit for measuring the intermediate circuit voltage.

DETAILED DESCRIPTION OF THE DRAWING

FIG. 1 shows a frequency converter 100 having: an intermediate circuit capacitor 1 at which an intermediate circuit voltage UG is present, an inverter 2 in a B6 topology with three bridge arms for generating control voltages U, V, W for an electric motor 16 with a variable frequency and a variable amplitude from the intermediate circuit voltage UG, and a circuit 3 for measuring the intermediate circuit voltage UG.

The inverter 2 conventionally generates the control voltages U, V, W using pulse width modulation.

The circuit 3 for measuring the intermediate circuit voltage UG has a resistive voltage divider 4 having resistors 5 and 6, the intermediate circuit voltage UG being applied to the first side of the resistive voltage divider 4 and the second side of the latter being electrically connected to a reference potential or to the negative intermediate circuit potential.

The circuit 3 for measuring the intermediate circuit voltage UG also has a capacitive voltage divider 7 having capacitors 8 and 9, the intermediate circuit voltage UG being applied to the first side of the capacitive voltage divider 7 and the second side of the latter being electrically connected to the reference potential.

A connecting node 10 of the resistors 5 and 6 of the resistive voltage divider 4 is electrically connected to a connecting node 11 of the capacitors 8 and 9 of the capacitive voltage divider 7.

The frequency converter 100 also has an evaluation unit 12 which evaluates a measurement voltage UM generated by means of the resistive voltage divider 4 and the capacitive voltage divider 7 for the purpose of measuring the intermediate circuit voltage UG.

The evaluation unit 12 has an A/D converter 13, the A/D converter 13 being designed to sample the measurement voltage UM generated by means of the resistive voltage divider 4 and the capacitive voltage divider 7 in the middle of a respective period of the pulse width modulation.

A capacitance of the base capacitor 9 of the capacitive voltage divider 7, at which the measurement voltage UM is present, is greater approximately by a factor of 40 than the capacitance of the further capacitor 8 of the capacitive voltage divider 7.

The resistor divider ratio of the resistors 5 and 6 of the resistive voltage divider 4 is selected in such a manner that the intermediate circuit voltage UG is divided into digitally evaluable levels.

The frequency converter 100 also has an active rectifier 14 for generating the intermediate circuit voltage UG from a mains AC voltage 17 and a filter inductor 17 which is looped in between an output pole 14*a* of the rectifier 14 and a connection of the intermediate circuit capacitor 1. Another capacitor 18 is provided at the output of the active rectifier 14.

It goes without saying that the resistive voltage divider 4 and/or the capacitive voltage divider 7 may also have more than the illustrated resistors and/or capacitors.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A frequency converter, comprising:
   an intermediate circuit capacitor at which an intermediate circuit voltage is present;
   an inverter for generating control signals with a variable frequency and a variable amplitude from the intermediate circuit voltage; and
   a circuit for measuring the intermediate circuit voltage, wherein the circuit for measuring the intermediate circuit voltage comprises:
      a resistive voltage divider, the intermediate circuit voltage being applied to a first side of the resistive voltage divider and a second side of the resistive voltage divider being electrically connected to a reference potential in the form of a negative intermediate circuit potential,
      a capacitive voltage divider, the intermediate circuit voltage being applied to a first side of the capacitive voltage divider and a second side of the capacitive voltage divider being electrically connected to the reference potential in the form of the negative intermediate circuit potential,
      at least one connecting node of resistors of the resistive voltage divider being electrically connected to a corresponding connecting node of capacitors of the capacitive voltage divider, and
      an evaluation unit that evaluates a measurement voltage generated by the resistive voltage divider and the capacitive voltage divider against the negative intermediate circuit potential for measuring the intermediate circuit voltage,
   wherein the evaluation unit comprises an analog-to-digital (A/D) converter, and
   the A/D converter is configured to sample the measurement voltage generated by the resistive voltage divider and the capacitive voltage divider in a middle of a respective period of the pulse width modulation.

2. The frequency converter according to claim 1, wherein the inverter generates the control signals using pulse width modulation.

3. The frequency converter according to claim 1, further comprising:
   a rectifier for generating the intermediate circuit voltage from a mains AC voltage; and
   a filter inductor which is looped in between an output pole of the rectifier and a connection of the intermediate circuit capacitor.

4. A frequency converter, comprising:
   an intermediate circuit capacitor at which an intermediate circuit voltage is present;
   an inverter for generating control signals with a variable frequency and a variable amplitude from the intermediate circuit voltage; and
   a circuit for measuring the intermediate circuit voltage, wherein the circuit for measuring the intermediate circuit voltage comprises:
      a resistive voltage divider, the intermediate circuit voltage being applied to a first side of the resistive voltage divider and a second side of the resistive voltage divider being electrically connected to a reference potential,
      a capacitive voltage divider, the intermediate circuit voltage being applied to a first side of the capacitive voltage divider and a second side of the capacitive voltage divider being electrically connected to the reference potential,
      at least one connecting node of resistors of the resistive voltage divider being electrically connected to a corresponding connecting node of capacitors of the capacitive voltage divider, and
      an evaluation unit that evaluates a measurement voltage generated by the resistive voltage divider and the capacitive voltage divider for measuring the intermediate circuit voltage, wherein
   a capacitance of a capacitor of the capacitive voltage divider, at which the measurement voltage is present, is greater by a factor of 10 to 100 than a capacitance of a further capacitor of the capacitive voltage divider.

\* \* \* \* \*